United States Patent Office 3,690,921

Patented Sept. 12, 1972

3,690,921

METHOD FOR STRONGLY ADHERING A METAL FILM ON CERAMIC SUBSTRATES

Glenn V. Elmore, Vestal, N.Y., assignor to International Business Machines Corporation, Armonk, N.Y.

No Drawing. Filed Dec. 7, 1970, Ser. No. 95,940
Int. Cl. C23c *3/02;* C04b *41/38*
U.S. Cl. 117—54 9 Claims

ABSTRACT OF THE DISCLOSURE

A method for metal plating ceramic substrates is provided. A ceramic substrate is prepared for metal plating by cleaning the substrate with a hot cleaning alkaline solution, rinsing with water, immersing the substrate in concentrated alkali metal hydroxide solution and heating to a temperature sufficient to remove water from the solution and thereby depositing the solid alkali metal hydroxide on the surface. Further heating the substrate to a temperature above the melting point of the deposited alkali metal hydroxide for a time sufficient to cause the molten alkali metal hydroxide to alter the surface by etching of both the $Al_2O_3$ and the binder in the substrate and thereafter cooling, rinsing and neutralizing the alkali metal hydroxide. Alternately, the cleaned dry substrate may be directly immersed in molten alkali metal hydroxide and rinsed in the same manner as before. The so-treated substrate may then be subjected to an electroless deposition bath for metal plating thereon. The resultant metal film is found to be strongly bonded to the ceramic substrate.

BACKGROUND OF THE INVENTION

Field of the invention

The present invention is directed to a method for effecting a strong metal to ceramic bond. More specifically, the invention is directed to a method of treating a ceramic substrate with a molten alkali metal hydroxide prior to the deposition of a metal film thereon.

PRIOR ART

Ceramic materials are presently being considered for use in the printed circuit technology as substrates, upon which circuitry is disposed by plating techniques. In the preparation of the circuitry it is necessary to deposit a metal film generally, copper, in a predetermined pattern to describe a desired circuit. Ceramic materials are considered because of their insulative and heat conducting properties. The difficulty in using ceramic materials as substrates in plated metal printed circuitry is that up until presently, good metal to substrate bonding has been unattainable. It has been found that by use of the presently known technology of treating substrates, the plated copper peels away from the substrate due to the lack of good adherence or bonding thereto.

One technique of preparing a conductive pattern on a ceramic substrate is by screening a conductive paste in a predetermined pattern onto a ceramic substrate and firing the coated ceramic substrate to effect a bond of the conductive paste to the ceramic substrate. While this method has met with some success, it has been found to be rather expensive. A more economical method would be the use of conventional plating technology. The plating technology requires far less expensive materials and gives greater circuit density than can be obtained by the screening technique.

It is generally known in the art to treat a substrate in a strong alkaline solution prior to plating the same. For example, in U.S. Patent No. 2,764,502 there is disclosed a method of treating resinous materials to improve their adhesion characteristics by surface treating the plastic with a strong hot alkaline solution for a few minutes and then rinsing off excess solution and drying. An electroless copper plate may then be applied to the substrate. In U.S. Patent No. 3,202,589 there is disclosed a method of electroplating zinc base die castings by anodically treating the castings in a strong alkaline electrolyte for surface modification, after which the electroplating operation is performed. In U.S. Patent No. 2,955,954, a process for treating shaped articles prepared from synthetic polymers is provided and in which the article is treated with a caustic solution of sufficient strength to activate the surface of the article. Sodium bicarbonate is the preferred caustic. U.S. Patent No. 3,296,012 discloses a method of electrolessly depositing copper onto the surface of a ceramic substrate. The method includes leaching the substrate with a strong acid and further treatment in hydrogen peroxide.

There is no disclosure of utilizing a molten alkali metal hydroxide to modify the surface of a ceramic substrate in any of the above-mentioned prior art.

SUMMARY OF THE INVENTION

There is provided a method for electrolessly and/or electrolytically metal plating a ceramic surface which includes the treating of the surface with molten alkali metal hydroxide prior to metal deposition. The method is characterized by the altering of the ceramic surface by the molten alkali metal hydroxide. Stepwise, the method is comprised of cleaning a ceramic substrate in a hot K-2 solution (an alkaline cleaning solution prepared by The Pennsalt Co.) to remove grease, powder and the like from the surface of the ceramic substrate, immersing the substrate in concentrated alkaline solution, e.g., 50 grams of sodium hydroxide dissolved in 100 ml. of water, removing the substrate from the alkaline solution and heating at a temperature of about 170° C. to remove water and thereby deposit a film of the alkali metal hydroxide on the surface of the substrate, heating the substrate at a temperature sufficient to fuse the alkali metal hydroxide film on the surface of the ceramic surface and for a time sufficient for the fused alkali to alter the surface of the substrate. Alternately, the clean, dry substrate may be directly immersed in a container of alkali metal hydroxide heated at a temperature above the melting point of the alkali metal hydroxide. The substrate is cooled and rinsed in water and thereafter re-rinsed in a dilute acid solution to neutralize the alkali. The substrate is finally rinsed in water to remove the acid and fines of $Al_2O_3$ and thereafter dried. The substrate can then be immersed in a conventional electroless plating bath to deposit a strongly adhering metal onto the surface and without further treatment of the surface. Metal to substrate bonds are obtained by this treatment having values of 6 to 8 lbs. per inch according to the 90° peel test. In pull tests strength on 150 mil copper dots on the treated surface provided bond strengths sufficient to break the wafer without removing the metal adhering thereto. For example, as much as 85 lbs. of pull was exerted without removing the coated copper film.

OBJECTS OF THE INVENTION

It is an object of the invention to provide a method for strongly adhering a metal to a ceramic surface.

It is another object of the invention to provide a novel method of treating the surface of a ceramic material prior to metal deposition thereon.

It is a further object of the invention to provide a method which is featured by the step of treating the surface with a molten alkali metal hydroxide.

PREFERRED EMBODIMENTS OF THE INVENTION

In accordance with conventional electroless copper plating methods, a substrate is suitably cleaned in an aqueous alkaline solution. The cleaned substrate can be sensitized in a variety of media. A preferred sensitizing solution is an aqueous composition containing 160–165 grams of stannous chloride dihydrate, 170–175 cc. of reagent grade hydrochloric acid, and 1 gallon of distilled water. This sensitizing solution should be maintained at a temperature of from 70–80° F. The substrate is immersed in this solution for 5 to 7 minutes. It is contemplated that the substrate may also be sensitized by immersing them in the following types of solutions: an aqueous hydrochloric acid solution of titanium trichloride; an aqueous ammonium hydroxide solution of silver nitrate; an aqueous solution of hydroquinone and ethanol; and an aqueous composition of stannous fluoroborate and free fluoroboric acid.

Following the sensitizing treatment, the substrate is rinsed in water and immersed in an activating solution, the purpose of which is to deposit a film of a seeding metal onto the substrate. The preferred activating solutions will deposit either gold, silver or palladium. An activating composition is prepared by adding 0.3 to 2 grams of $PdCl_2 \cdot 2H_2O$, dissolved in a distilled or deionized water, to 40 to 160 cc. of concentrated reagent grade HCl. This solution will be maintained at a temperature of from 70° F. to 80° F. The substrate is immersed in this solution for 2 to 4 minutes.

Thereafter, the substrate is immersed in the plating bath comprising, for example, an aqueous solution containing a salt of copper and an alkali metal hydroxide in the presence of salts such as potassium sodium tartrate, and/or sodium carbonate. The substrate is immersed for a time sufficient to form a conductive coating.

The instant invention may be carried out by using any conventional aqueous electroless metal plating bath solution. For example, a nickel or copper electroless plating bath may be used. An example of one suitable copper plating bath is as follows:

| Component | Lower limit | Upper limit |
|---|---|---|
| Copper sulfate pentahydrate, g./gal | 165 | 175 |
| Formaldehyde (37%), ml./gal | 1,880 | 1,900 |
| Nickel chloride hexahydrate, g./gal | 63 | 72 |
| Sodium hydroxide, g./gal | 152 | 162 |
| Rochelle salts, g./gal | 695 | 710 |
| Sodium carbonate, g./gal | 68 | 77 |

A typical electroless Ni bath may be prepared as follows:

$2NiCo_3.3Ni(OH)_24H_2O$—10 g./l.
HF (as 50% HF)—6 ml./l.
Citric acid—5.5 g./l.
$NH_4HF_2$—10 g./l.
$NaH_2PO_2.H_2O$—20 g./l.
$NH_4OH$—30 ml./l.
pH—4.5–6.8
Temperature—170–180° F.

The $Al_2O_3$ ceramic substrates used in this invention are prepared by standard techniques. For example, a binder of glass and $Al_2O_3$ powder is mixed with an organic binder and rolled into sheets. The sheets are heated to a temperature sufficient to burn away the organic binder and then fired at a temperature sufficient to melt the glass component and the resultant sintered substrate is cooled. Other pure $Al_2O_3$ substrates are made by sintering the $Al_2O_3$ itself.

Typically, the method of this invention may be carried out as follows:

A one-half inch square substrate of sintered alumina ($Al_2O_3$) having a thickness of about 1/16 inch is suitably cleaned by dipping in an alkaline solution, e.g., 8 oz./gal. of K–2 (an alkaline cleaning solution prepared by The Pennsalt Co.). The solution is heated to a temperature of about 60° C. and the substrate is allowed to remain therein for about 2 minutes. The alumina substrate is rinsed in water and then immersed for one minute in a concentrated sodium hydroxide solution containing about 50 grams of NaOH per 100 ml. of water. Upon removal of the alumina substrate from the alkaline solution it is heated for about 5 minutes at a temperature of about 170° C. to remove water and to thereby deposit a coating of NaOH on the surface of the substrate. The NaOH coated substrate is then heated for about 10–15 minutes at temperature sufficient to melt the NaOH on the substrate surface, e.g., between 318° C. to about 1000° C. Optimally, it is heated in a temperature range of about 450° C. to about 500° C. After cooling, to about room temperature, the substrate with its coating of solid NaOH is rinsed in water to remove most of the NaOH and thereafter rinsed in a dilute acid solution, e.g., a 20% solution of HCl, $H_2SO_4$ or $HNO_3$ for about 2 minutes. The substrate is finally thoroughly rinsed in water with ultrasonic agitation.

The so treated alumina substrate is sensitized, activated and placed in a conventional copper electroless plating bath such as hereinabove described for about 20 minutes. It was found that a well adhered copper coating of about 0.00025 inch thick was deposited upon the alumina. Then, the treated substrate is immersed in an electrolytic plating bath thereby having a copper layer electrolytically deposited.

Alternately, the cleaned substrate is immersed directly into the molten alkali metal salt. The alkali metal salt is heated in a container above its melting point, e.g., between 318° C. and 1000° C., preferably, at about 450° C. to about 500° C., and the substrate is immersed therein for about 10–15 minutes. This direct immersion technique eliminates the above steps of heating to deposit an alkali metal hydroxide coating on the substrate and thereafter causing the alkali metal hydroxide to become molten.

Bonding tests were made to determine how strongly the copper coating adhered to the alumina. The pull test on 150 mil diameter copper dots gave values of up to 85 lbs. i.e., sufficient energy was applied in trying to remove the copper dot to break the substrate. The 90° peel test indicated bond strengths of 6 to 8 lb./inch.

While the invention has been illustrated to specifically show its applicability using NaOH, it should be realized that other alkali metal hydroxides can be used. For example, LiOH or KOH may also be used to advantage. Although alumina has been illustrated as a typical ceramic substrate, it is celar that other ceramic materials can be used. For example, zircon, beryllia, steatite or silicate glass-ceramics can be used for the same purposes and treated in the same manner as is described in the instant invention. Further, it should also be realized that while the examples of this invention have indicated heating of the substrate to 170° C. for a period of 5 minutes to remove water and thereby deposit the alkali metal hydroxide on the substrate, other temperatures and times can be used. It is readily apparent that lower temperatures would require heating for longer time periods and vice versa. It should therefore, be apparent to those skilled in the art that other variations of the invention readily present themselves and are incorporated herein.

What is claimed is:

1. A method for electrolessly depositing a strongly adhering layer of metal on the surface of a ceramic substrate comprising the steps of:

(a) cleaning said substrate by immersing the same in an alkaline cleaning solution;

(b) rinsing said substrate in water;

(c) depositing a coating of an alkali metal hydroxide on the surface of said cleaned substrate by immersing said substrate in an alkali metal hydroxide solution and thereafter heating the substrate at a temperature and for a time sufficient to remove water from said solution;

(d) altering the surface of said substrate by heating the same at a temperature between about 318° C. to about 1000° C. to melt said alkali metal hydroxide coating on said substrate's surface;

(e) cooling the substrate and rinsing the substrate in a dilute acid solution to neutralize said alkali metal hydroxide;

(f) rinsing the substrate in water;

(g) sensitizing and activating the substrate, and thereafter (h) immersing said altered substrate in an electrolesss metal plating bath for a time sufficient to deposit a strongly adhering metal layer thereon.

2. A method according to claim 1 wherein said alkali metal hydroxide solution of step (c) consists of about 50 grams of sodium hydroxide dissolved in 100 ml. of water.

3. A method according to claim 2 wherein said coating of an alkali metal hydroxide is deposited on said substrate by heating at a temperature of about 170° C. for a duration of 5 minutes.

4. A method according to claim 3 wherein said surface of said substrate is altered by heating the same to a temperature of about 450° C. to about 500° C.

5. A method according to claim 4 wherein said altered substrate is rinsed in a 20% acid solution selected from the group consisting of HCl, $H_2SO_4$ and $HNO_3$, for about 2 minutes.

6. A method according to claim 1 wherein the molten alkali metal hydroxide is maintained at a temperature of about 450° C. to about 500° C.

7. A method of electrolessly depositing a metal onto a surface of a ceramic substrate comprising the steps of:

(a) cleaning the substrate in a hot alkaline cleaning solution;

(b) rinsing the clean substrate in water;

(c) immersing said clean substrate in a molten alkali metal hydroxide;

(d) removing the substrate from said molten alkali metal hydroxide;

(e) cooling the substrate;

(f) rinsing the substrate in a dilute acid solution to neutralize said alkali metal hydroxide;

(g) rinsing the substrate in water to remove acid from said substrate;

(h) sensitizing and activating the substrate, and thereafter, (i) immersing said altered substrate in an electroless metal plating bath for a time sufficient to deposit a strongly adhering metal film thereon.

8. A method according to claim 7 wherein said alkaline cleaning solution is maintained at a temperature of about 60° C.

9. A method according to claim 7 wherein the molten alkali metal hydroxide is maintained at a temperature in the range of about 318° C. to about 1000° C. and for a duration of about 10 to about 15 minutes.

References Cited

UNITED STATES PATENTS

| | | | |
|---|---|---|---|
| 1,806,589 | 5/1931 | Espig et al. | 156—2 |
| 2,510,219 | 6/1950 | Graham | 156—2 |
| 2,871,139 | 1/1959 | Wein | 117—54 |

FOREIGN PATENTS

| | | | |
|---|---|---|---|
| 685,785 | 5/1964 | Canada | 117—54 |

WILLIAM D. MARTIN, Primary Examiner

D. COHEN, Assistant Examiner

U.S. Cl. X.R.

117—62.1, 123 A, B, 160 R; 156—2